United States Patent
Seward et al.

(10) Patent No.: US 12,326,766 B2
(45) Date of Patent: Jun. 10, 2025

(54) PORTABLE COOLING ELECTRONICS CASE

(71) Applicants: Samuel Parrish Seward, Bogart, GA (US); Luke Daniel Eley, Statham, GA (US)

(72) Inventors: Samuel Parrish Seward, Bogart, GA (US); Luke Daniel Eley, Statham, GA (US)

( * ) Notice: Subject to any disclaimer, the term of this patent is extended or adjusted under 35 U.S.C. 154(b) by 228 days.

(21) Appl. No.: 18/104,625

(22) Filed: Feb. 1, 2023

(65) Prior Publication Data
US 2023/0244285 A1    Aug. 3, 2023

Related U.S. Application Data

(60) Provisional application No. 63/305,703, filed on Feb. 2, 2022.

(51) Int. Cl.
*H05K 7/20* (2006.01)
*G06F 1/20* (2006.01)
*H10N 10/10* (2023.01)

(52) U.S. Cl.
CPC ......... *G06F 1/203* (2013.01); *H05K 7/20272* (2013.01); *H05K 7/20281* (2013.01); *H10N 10/10* (2023.02)

(58) Field of Classification Search
None
See application file for complete search history.

(56) References Cited

U.S. PATENT DOCUMENTS

| | | | | |
|---|---|---|---|---|
| 5,269,146 A | * | 12/1993 | Kerner | H10N 10/13 62/3.62 |
| 5,605,047 A | * | 2/1997 | Park | F25D 23/003 62/3.6 |
| 5,809,785 A | * | 9/1998 | Polkinghorne | H10N 10/13 62/3.2 |
| 9,618,406 B2 | * | 4/2017 | Kroeger | G01L 19/04 |
| 10,694,638 B1 | * | 6/2020 | Lin | H05K 7/20209 |
| 11,871,665 B2 | * | 1/2024 | Hatasako | H10N 10/13 |
| 11,888,287 B2 | * | 1/2024 | Thompson | H01S 3/0407 |
| 2020/0403555 A1 | * | 12/2020 | Mills | H02S 10/30 |
| 2022/0061187 A1 | * | 2/2022 | Shao | H10N 10/80 |

* cited by examiner

*Primary Examiner* — Courtney L Smith
(74) *Attorney, Agent, or Firm* — Kilpatrick Townsend & Stockton LLP

(57) ABSTRACT

Disclosed systems include a case for cooling electronic devices. In an example, the case includes a thermo-electric cooler that includes a first side positioned on an interior of the case and a second side opposite the first side and adjacent to a first outer side of the case. The thermo-electric cooler is configured to transfer heat from the first side to the second side. The case further includes a pump and a length of tubing connected to the pump. The tubing includes a first section positioned adjacent to the first side of the thermo-electric cooler, and a second section positioned adjacent a second outer side of the case. The pump is configured to pump coolant through the length of tubing, thereby facilitating cooling of the coolant by the thermo-electric cooler. The case further includes a power source configured to power the pump and power the thermo-electric cooler.

15 Claims, 5 Drawing Sheets

PORTABLE COOLING ELECTRONICS CASE

CROSS-REFERENCE TO RELATED APPLICATION

This application claims priority to U.S. Provisional Patent Application No. 63/305,703 titled "Portable Cooling Electronics Case" and filed Feb. 2, 2022, the contents of which are incorporated by reference herein for all purposes.

TECHNICAL FIELD

This disclosure relates generally to cooling devices and more specifically, but without limitation, a portable electronics case that uses liquid-cooling to prevent overheating of electronic devices.

BACKGROUND

Electronic devices typically generate heat when operating. If generated heat from an electronic device is not managed, the excess heat may result in electronic components operating less efficiently, degrading, and in the case of batteries, possibly causing fires. Damaged electronics are often discarded. There are an estimated 3.5 billion cell phones in use worldwide but roughly 85% of smartphones are replaced every three years due to battery performance issues. In the U.S., 130 million smartphones are disposed of each year. Many portable electronic devices generally lack robust cooling and heat management systems. Accordingly, new solutions are needed.

SUMMARY

Disclosed systems include a case for cooling electronic devices. In an example, the case includes a thermo-electric cooler. The thermo-electric cooler includes a first side positioned on an interior of the case and a second side opposite the first side and adjacent to a first outer side of the case. The thermo-electric cooler is configured to transfer heat from the first side to the second side. The case further includes a pump and a length of tubing connected to the pump. The tubing includes a first section positioned adjacent to the first side of the thermo-electric cooler, and a second section positioned adjacent a second outer side of the case. The pump is configured to pump coolant through the length of tubing between the second section and the first section, thereby facilitating cooling of the coolant by the thermo-electric cooler. The case further includes a power source configured to power the pump and power the thermo-electric cooler.

BRIEF DESCRIPTION OF THE FIGURES

These and other features, aspects, and advantages of the present disclosure are better understood when the following Detailed Description is read with reference to the accompanying drawings, where.

DETAILED DESCRIPTION

Disclosed solutions relate to cooling devices for cooling portable electronic devices. Thermal management of electronic devices is also important in high-heat environments, such as at a beach in the summer or in tropical environments. Exposing an electronic device to high-heat environments may also damage the electronic device. Batteries and other components may be damaged in high heat environments, which may shorten the useful life-spans of these components.

But existing solutions are deficient. For example, heat management systems for portable electronic devices sometimes include a fan that is clipped to the back of the device. A fan-based cooling approach suffers from several deficiencies, for example, in addition to being cumbersome, the fan is often too loud for portable devices. Moreover, such a solution is limited by a lack of gaps in electronic devices through which air can effectively circulate. Another common heat management system for electronic devices is to simply turn off the device when the electronic device overheats. But this approach is not ideal either, as the user can no longer operate the device. Additionally, turning off the portable electronic device only manages the heat generated by the electronic device, and does not protect the electronic device in high-heat environments.

Reference will now be made in detail to various and alternative illustrative examples and to the accompanying drawings. Each example is provided by way of explanation, and not as a limitation. It will be apparent to those skilled in the art that modifications and variations can be made. For instance, features illustrated or described as part of one example may be used on another example to yield a still further example. Thus, it is intended that this disclosure include modifications and variations as come within the scope of the appended claims and their equivalents.

Disclosed solutions include cooling devices, or heat management systems, that protect electronic components such as batteries, integrated circuits, and other components, within electronic devices from getting damaged from overheating, resulting in longer life and higher use time before cooling is needed. In so doing, disclosed solutions can reduce the number of devices that get thrown away each year due to battery failure. As discussed herein, disclosed solutions address heat management of portable devices by circulating fluid through a case to cool the device and/or using thermo-electric coolers.

Figure 1:
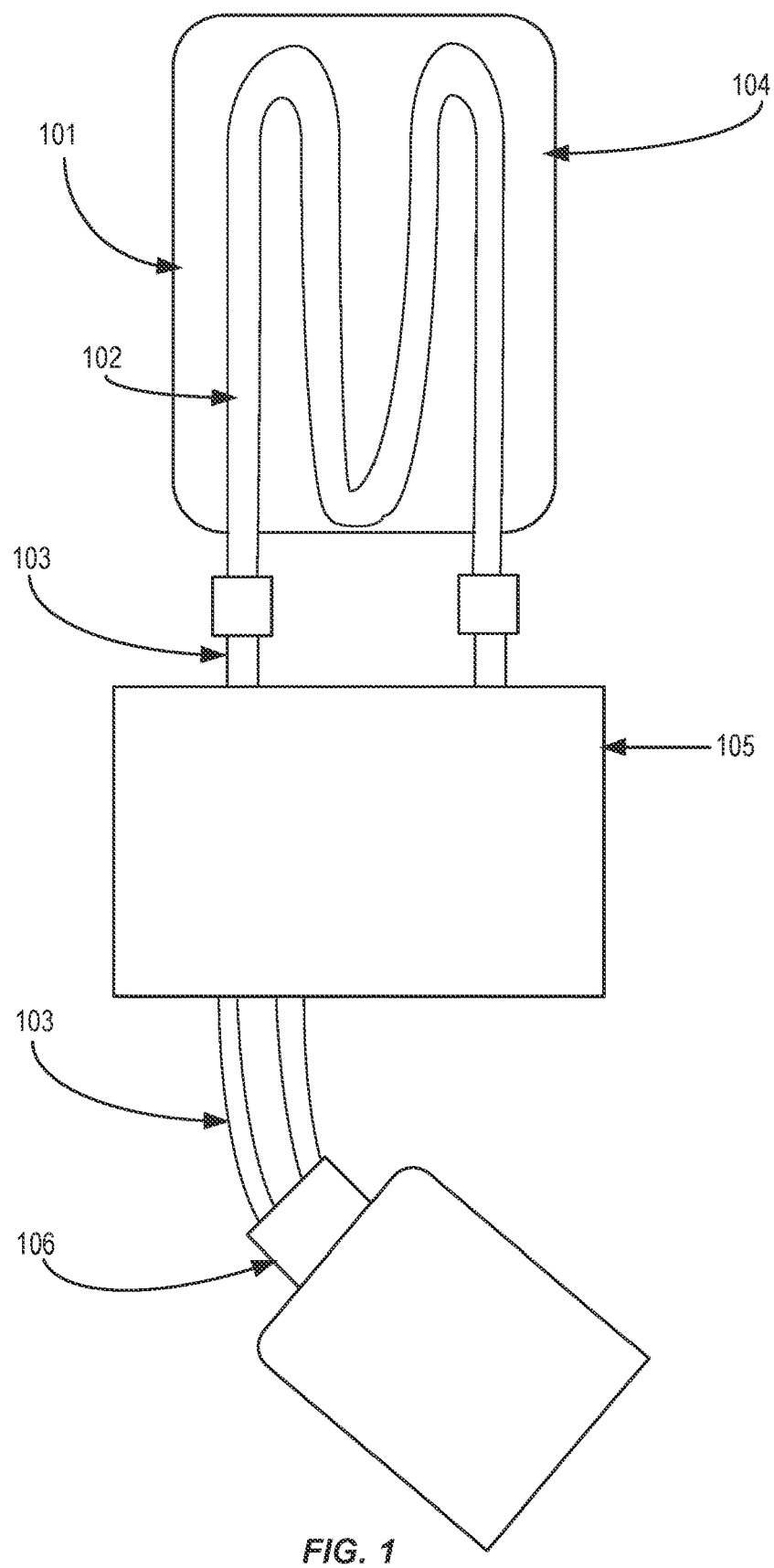
FIG. 1 depicts an exemplary cooling device, in accordance with an aspect of the present disclosure.

Turning now to the Figures, FIG. 1 depicts an exemplary cooling device 100, in accordance with an aspect of the present disclosure. Cooling device 100 includes a cooling plate 101, pipe 102, tubing 103, insulated case 104, connection component 105, and coolant tank 106. During operation, an electronic device (not depicted) is placed adjacent to cooling plate 101. The cooling plate 101 and the electronic device are optionally inserted into insulated case 104.

As depicted, cooling plate 101 is made of copper. But cooling plate 101 can be formed of any heat-conducting material such as aluminum, copper, nickel, and so forth. As depicted, a coolant flows through pipe 102, thereby cooling the cooling plate 101 with a pipe 102 attached to one side. The piping 102 is connected to tubing 103. Examples of coolants include water, distilled water, and coolant. Tubing 103 can connect to a coolant tank 106 by a connection component 105. In some examples, the coolant can be water, or a coolant such as liquid nitrogen, or a glycol solution.

Tubing 103 includes a first tubing and a second tubing, each of which connect to a respective end of pipe 102. In this manner, coolant flows from a source such as the coolant tank 106, through the first tubing, the pipe 102, returning to the source through the second tubing, which cools the electronic device in the casing. In some examples, the tubing may be made of various materials such as copper, aluminum, or iron. In some examples, the tubing may be made of a flexible plastic.

Connection component 105 connects tubing 103 to the coolant tank (not depicted). The connection component 105 has openings to allow the tubing 103 to pass through the openings in the connection component 105. The connection component 105 may be attached to the coolan tank 106. The openings of the connection component 105 are configured so that the tubing 103 fit through connection component 105 so that the coolant is prevented from spilling out of the coolant tank 106 through the opening in the connection component 105. In an aspect, insulated case 104 includes holes through which the tubing 103 can pass.

The connection component 105 connects the tubing 103 to the coolant tank 106. In some examples, the connection component 105 is a removable lid twisted onto the coolant tank 106. In other examples, the connection component 105 is not removable from the coolant tank 106.

The coolant tank 106 may store liquids, such as water or other coolants. In some examples, the coolant tank 106 may be elevated above the cooling plate 101 to allow coolant to drain from the coolant tank 106 through tubing 103 and pipes 102 to cool the cooling plate 101.

Figure 2:
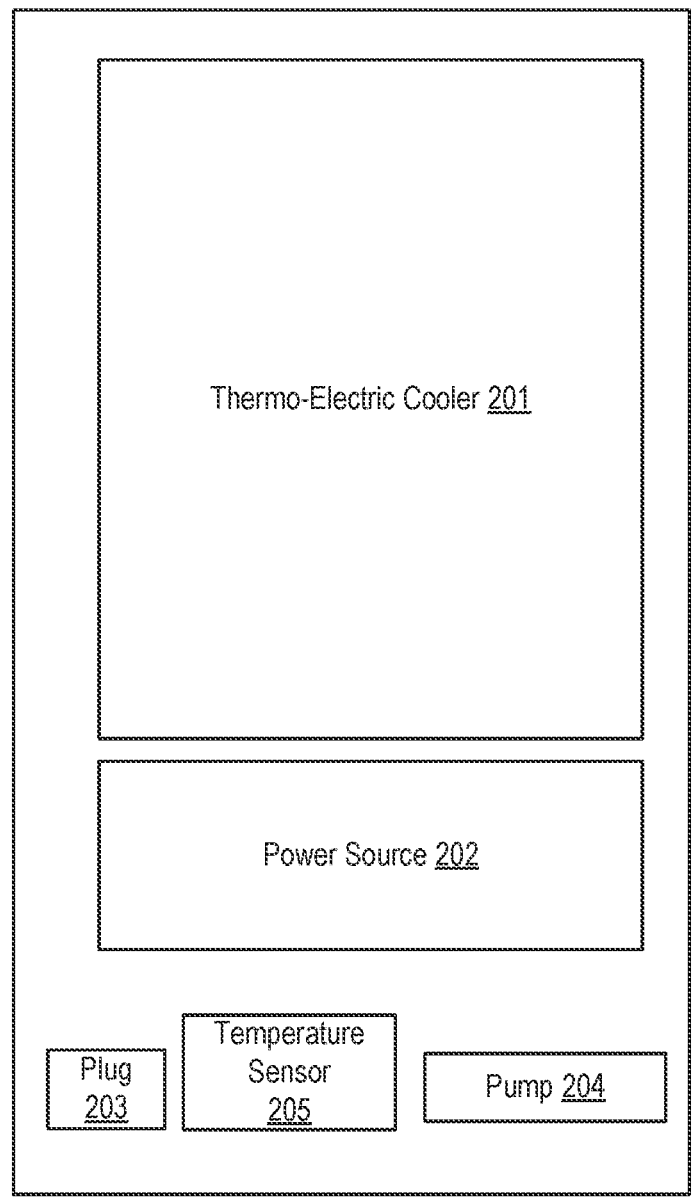
FIG. 2 depicts a block diagram of an exemplary cooling device, in accordance with an aspect of the present disclosure.

FIG. 2 depicts a block diagram of an exemplary cooling device 200, in accordance with an aspect of the present disclosure. Cooling device 200 includes thermo-electric cooler 201, power source 202, plug 203, pump 204, and temperature sensor 205. In the example depicted, a liquid coolant (not shown) is cooled by thermo-electric cooler 201. Pump 204 pumps the coolant to tubing (not shown) adjacent to a portable device (not shown) thereby cooling the portable device, as discussed further with respect to FIG. 3. In some examples (not depicted), cooling device 300 can include a computing device, or a controller, that can be configured to control various functions and devices of the cooling device such as the temperature sensor, the pump, and so forth. An example of such a computing device is discussed further with respect to FIG. 5.

Thermo-electric cooler 201 is a solid-state device that uses the Peltier effect to transfer heat between sides of the solid-state device, for example between a first side positioned near a device or object to be cooled and a second side from which heat can be dispersed. The thermo-electric cooler 201 may be used to cool the coolant adjacent to the thermo-electric cooler.

The Peltier effect is a cooling and heating effect that occurs at the junction of two different materials in a circuit when current is flowing through the circuit. The thermo-electric cooler 201 can include two or more plates of ceramic, or other material, with n-type and p-type semiconductors operably connected between the two or more plates. Power source 202 applies voltage to one or more leads of the thermo-electric cooler. Current flows through the semiconductors (not shown) of the thermo-electric cooler 201. The flow of electricity through the semi-conductors creates a cooling effect at one junction of the semi-conductors to a first plate, and a heating effect at another junction of the semiconductor to a second plate.

Thermo-electric cooler 201 is configured such that the semiconductor junctions cooled by the Peltier effect are on one side of the cooler (e.g., the first side) and the junctions heated by the Peltier effect are on the other side (e.g., the second side) of the cooler. The cooled side of the thermo-electric cooler 201 can be placed adjacent to the coolant thereby cooling the coolant. The heated side of the thermo-electric cooler is oriented away from the coolant.

The plug 203 allows for connecting the case to an exterior power source (not shown) to power the pump 204. If power source 202 is a battery, then power received via the plug 203 may also be used to charge the battery. The pump 204 is configured to pump coolant through tubing from a first portion of the case (not shown) to a second portion of the case (not shown), where the second portion of the case is adjacent to the portable device to be cooled.

The pump 204, powered by the power source 202 or power provided by plug 203, pumps the coolant cooled by the thermo-electric cooler 201 through tubing adjacent to the portable device. The coolant is pumped to the section adjacent to the thermo-electric cooler, and the pump may continue circulating the coolant. In some examples, the tubing is made of copper, aluminum, iron, or a plastic. Examples of suitable coolants include water and coolant. For example, some aspects may circulate other liquids that are better suited to transfer heat such as a solution including one or more other substances to improve the heat transfer. Other examples may include water, liquid nitrogen, or a glycol solution. In further examples, the cooling device 200 may include a removable liquid reservoir (not shown). For example, the removable liquid reservoir may include replaceable units of liquid nitrogen.

In some examples, the cooling device 200 includes a tubing arrangement that is a multi-pass layout or a planar spiral. In other examples, the tubing may be substantially the width and substantially the length of the case or the electronic device placed in the case. In further examples, tubing may be made of copper, aluminum, iron, or a plastic.

In an aspect, pump 204 operates intermittently rather than continuously. For example, to reduce power usage, the system may pump the liquid on a timer, or the pump may be configured to circulate the liquid when receiving a command. A computing device can control operation of the pump.

In another example, cooling device 200 includes a temperature sensor 205 placed near or adjacent to thermo-electric cooler 201 or power source 202, which can be used to control the pump 204. For instance, if a detected temperature rises above a threshold, a computing device can cause the pump 204 to be activated until such time as the detected temperature falls below the threshold again. At that time, pump 204 can be deactivated.

Figure 3:
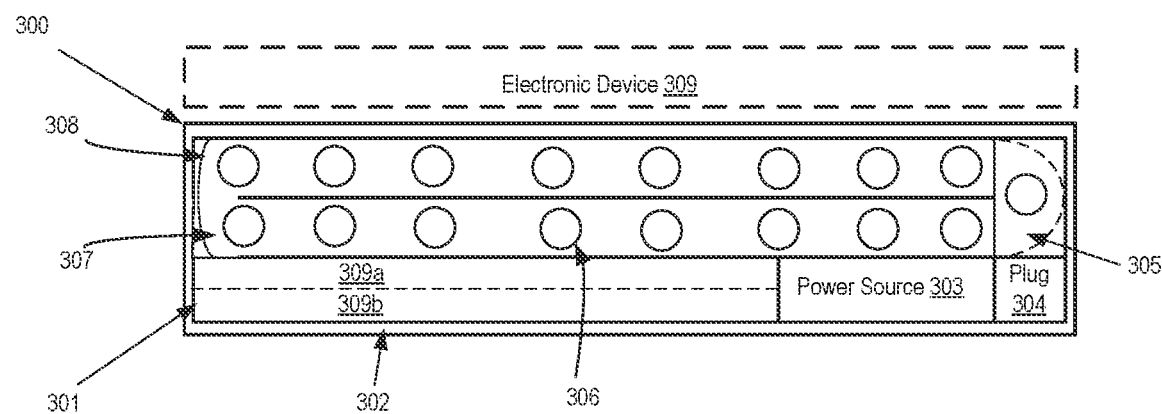
FIG. 3 depicts a cross-sectional view of an exemplary cooling device, in accordance with an aspect of the present disclosure.

FIG. 3 depicts a cross-sectional view of an exemplary cooling device 300, in accordance with an aspect of the present disclosure. Cooling device 300 includes thermo-electric cooler 301 with a cooled (e.g., first) side 309a and a heated (e.g., second) side 309b, protective barrier 302, power source 303, plug 304, pump 305, first section 307, second section 308, and electronic device 309. In the example depicted, cooling device 300 operates to cool electronic device 309.

Cooling device 300 includes a thermo-electric cooler 301 with cooled side 309a and heated side 309b. As depicted, the cooled side 309a is adjacent to tubing at the first section 307 of the cooling device 300 and the heated side 309b is positioned towards the exterior of the cooling case.

Thermo-electric cooler 301 may include two or more plates of ceramic, or other material, with n-type and p-type semiconductors operably connected between the two or more plates. Power source 303 applies voltage to one or more leads of the thermo-electric cooler 301. During operation of the thermo-electric cooler 301, an electric current flow through the semiconductors (not shown) of the thermo-electric cooler 301. The flow of electricity through the semi-conductors creates a cooling effect at one junction of the semi-conductors to a first plate (e.g. the cooled side 309a), and a heating effect at another junction of the semiconductor to a second plate (e.g. the heated side 309b).

The coolant 306 flows through tubing at a first section 307 of the cooling device 300, adjacent to the thermo-electric cooler 301. The coolant 306 is cooled by the cooled side 309a of thermo-electric cooler 301 when the coolant 306 is in the tubing at the first section 307 of the cooling device 300. The tubing at the first section 307 of the cooling device 300 is connected to the pump 305. Pump 305 pumps coolant 306 from tubing at the first section 307 of the cooling device 300, to tubing at a second section 308. The second section is located adjacent to an electronic device 309 to be cooled. Heat is transferred from the electronic device 309 to the coolant 306 in the tubing located at the second section 308, cooling the electronic device. When the coolant 306 from tubing at the first section 307 is pumped by pump 305 into tubing at the second section 308, the liquid in the tubing at the second section 308 is circulated back into the tubing at the first section 307. In some examples, the first section 307 and the second section 308 may connect only through the pump 305. In some examples, the first section 307 may be twice the size of the second section 308. In such examples, the pump 305 may be configured to pump liquid bi-directionally. For example, the pump 305 may pump from the second section 308 to the first section 307 or from the first section 307 to the second section 308.

In some examples, the first section 307 and second section 308 may be arranged in a multi-pass layout or a planar spiral. For example, in the multi-pass layout, the tubing in the first section and the tubing in the second section may pass multiple times from the outer side of the case to the thermo-electric cooler and back.

In further examples, an internal thermostat or temperature sensor is positioned to measure the temperature of the coolant. In some cases, the cooling case can facilitate the flow of more coolant based on the measured temperature. For example, when the measured temperature exceeds a threshold, then then a computing device can cause the pump to pump the coolant at a higher rate. Conversely, when the measured temperature falls below a threshold, then the controller can cause the pump to reduce the rate of flow of coolant.

In some examples, the cooling case includes a drain connected to the tubing through which coolant from the tubing can be drained and/or new fluid added.

Power source 303 provides power to the pump 305 and the thermo-electric cooler 301. Examples of a power source 303 includes a battery. A battery may be charged when connected to a power source through plug 304. Alternative examples of the cooling device 300 may be configured to be powered by non-rechargeable removable batteries. In some aspects of the cooling device 300, the cooling case may not have the plug 304. Further aspects may allow for the pump 305 and the thermo-electric cooler 301 to be powered through the plug 304 without the power source 303.

Thermo-electric cooler 301 can include protective barrier 302. Protective barrier 302 protects and insulates internal components of the cooling device 300, such as thermo-electric cooler 301, power source 303, plug 304, pump 305, and tubing at the first section 307 and the second section 308 of the cooling device 300. In some examples, the protective barrier may be shock absorbing and insulating lining made of rubber, neoprene, silicone, or polyurethane and may hermetically seal the tubing at the first section 307 and the tubing at the second section 308 within the cooling device 300.

Figure 4:
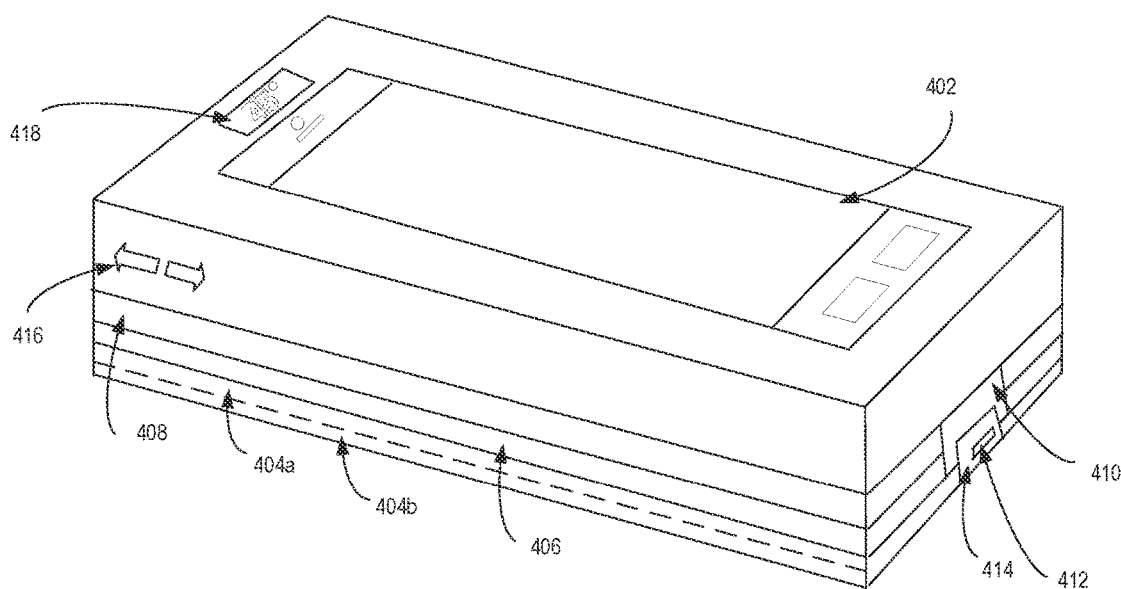
FIG. 4 depicts a diagonal view of an exemplary cooling device, in accordance with an aspect of the present disclosure.

FIG. 4 depicts a diagonal view of a cooling device 400, in accordance with an aspect of the present disclosure. The cooling device 400 may be a phone case, or other cases for an electronic device. Cooling device 400 includes a thermo-electric cooler with cooled side 404a and a heated side 404b, a first portion of tubing 406, a second portion of tubing 408, a pump 410, a plug 412, a temperature sensor 414, input buttons 416, and a display 418. In FIG. 4, the cooling device operates to cool electronic device 402.

Cooling device 400 includes a thermo-electric cooler with a cooled side 404a and a heated side 404b. The cooled side 404a and heated side 404b may comprise of ceramic plates connected to one each other by n-type and p-type semiconductors. The cooled side 404a may be located adjacent to the first portion of tubing 406. The cooled side 404a may be located adjacent to the first portion of tubing 406 to cool the coolant at the first portion of tubing 406. The second portion of tubing 408 may be located adjacent to the electronic device 402.

The pump 410 pumps coolant from the first portion of the tubing 406 to the second portion of the tubing 408 based on measurements from the temperature sensor 414 and inputs from users through input buttons 416. Users may input a minimum and maximum temperature level using input buttons 416. The pump 410 may pump the coolant based on the minimum and maximum temperature levels. For example, when a user sets a maximum temperature level, the pump 410 may pump cooled coolant from the first portion of tubing 406 to the second portion of tubing 408 when the temperature sensor 414 measurements of the electronic device exceed the maximum temperature level. In other examples, when the user sets a minimum temperature level, the pump 410 may pump coolant from the second portion of tubing 408 to the first portion of tubing 406.

The pump 410 is powered by a power source (not shown) such as a battery. The power source may be charged by plug 412. In some examples, the cooling device 400 may be powered by connecting the plug 412 to a power outlet. The cooling device 400 can include a display 418 to convey the temperature of the electronic device 402 or the coolant (not shown) to the user.

Figure 5:
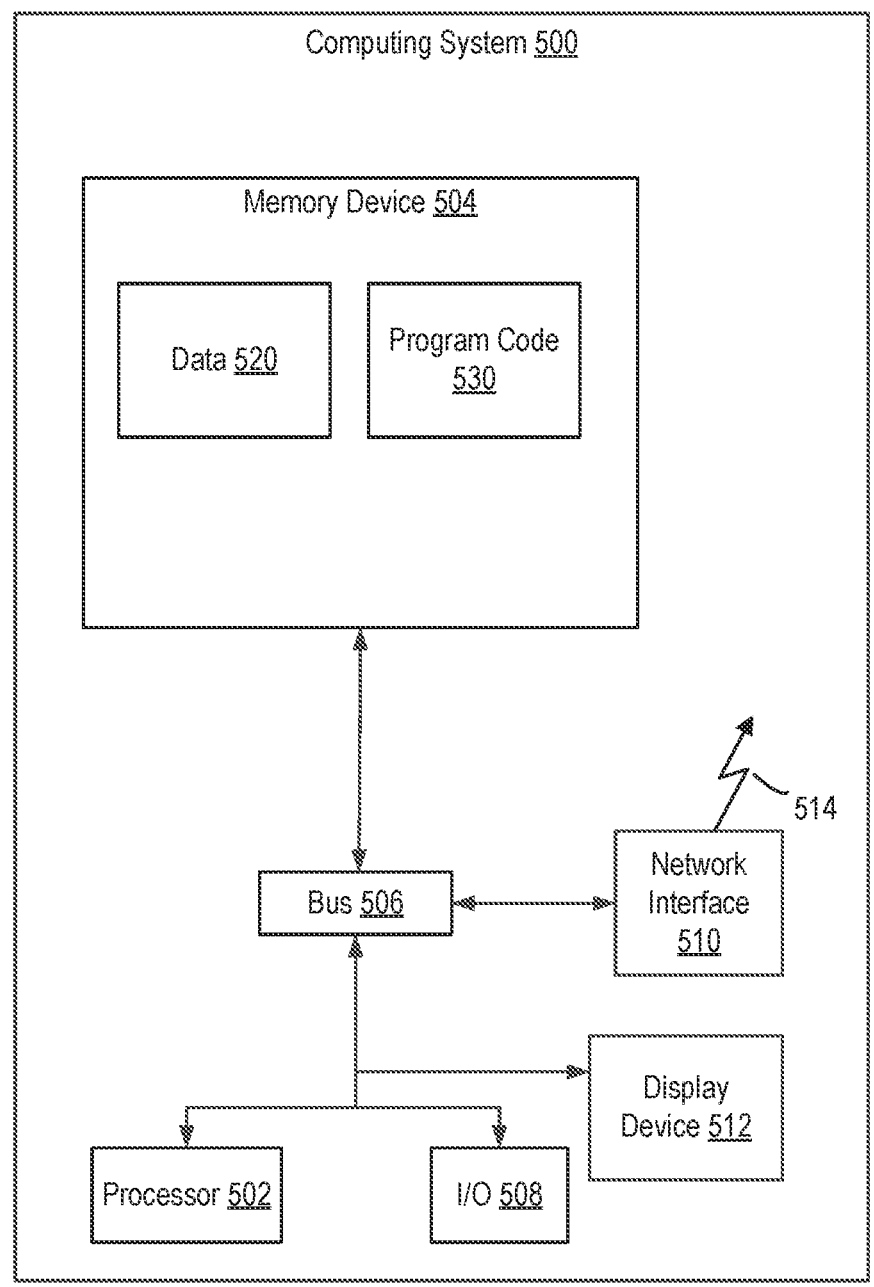
FIG. 5 illustrates a computing device used to implement certain functions of the cooling device, in accordance with an aspect of the present disclosure.

FIG. 5 illustrates a computing device used to implement certain functions of the cooling device, in accordance with an aspect of the present disclosure. The depicted computing device 500 includes a processor 502 communicatively coupled to one or more memory devices 504. The processor 502 executes computer-executable program code 530 stored in a memory device 504, accesses data 520 stored in the memory device 504, or both. Examples of the processor 502 include a microprocessor, an application-specific integrated circuit ("ASIC"), a field-programmable gate array ("FPGA"), or any other suitable processing device. The processor 502 can include any number of processing devices or cores, including a single processing device. The functionality of the computing device may be implemented in hardware, software, firmware, or a combination thereof.

The memory device 504 includes any suitable non-transitory computer-readable medium for storing data, program code, or both. A computer-readable medium can include any electronic, optical, magnetic, or other storage device capable of providing a processor with computer-readable instructions or other program code. Non-limiting examples of a computer-readable medium include a flash memory, a ROM, a RAM, an ASIC, or any other medium from which a processing device can read instructions. The instructions may include processor-specific instructions generated by a compiler or an interpreter from code written in any suitable computer-programming language, including, for example, C, C++, C#, Visual Basic, Java, or scripting language.

The computing device 500 may also include a number of external or internal devices, such as input or output devices. For example, the computing device 500 is shown with one or more input/output ("I/O") interfaces 508. An I/O interface 508 can receive input from input devices or provide output to output devices. One or more busses 506 are also included in the computing device 500. The bus 506 communicatively couples one or more components of a respective one of the computing device 500.

The computing device 500 executes program code 530 that configures the processor 502 to perform one or more of the operations described herein. For example, the program code 530 causes the processor to perform the operations described in FIG. 3.

The computing device 500 also includes a network interface device 510. The network interface device 510 includes any device or group of devices suitable for establishing a wired or wireless data connection to one or more data networks. The network interface device 510 may be a wireless device and have an antenna 514. The computing device 500 can communicate with one or more other computing devices implementing the computing device or other functionality via a data network using the network interface device 510.

The computing device 500 can also include a display device 512. Display device 512 can be a LCD, LED, touch-screen or other device operable to display information about the computing device 500. For example, information could include an operational status of the computing device, network status, etc.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

Additional Examples

According to another aspect, a system for cooling an electronic device may include an insulating casing configured to hold a phone; a pipe connected to one side of a metal plate, wherein the metal plate is located inside of the casing and can be placed adjacent to the phone; and one or more hoses, operably connected to ends of the pipe, and the hoses operably connected to a liquid holding device, wherein the liquid holding device is configured to allow liquid to flow through the hose and the pipe.

In another aspect, a method for cooling portable electronics includes: receiving an input for a temperature maximum and temperature minimum; cooling liquid at a first portion of tubing by a thermo-electric cooler adjacent to the first portion of tubing; measuring the temperature of a device, wherein when the temperature of the device exceeds the temperature maximum, pumping the liquid cooled by the thermo-electric cooler to a second portion of tubing adjacent to the device and wherein when the temperature of the device is below the minimum, pumping the liquid from the second portion of tubing to the first portion of tubing.

What is claimed is:

1. A case comprising:
a protective barrier defining an interior of the case, a first outer side of the case, and a second outer side of the case;
a thermo-electric cooler within the interior of the case, the thermo-electric cooler comprising a first side and a second side opposite the first side, wherein the second side of the thermo-electric cooler is adjacent to the first outer side of the case, wherein the thermo-electric cooler is configured to transfer heat from the first side of the thermo-electric cooler to the second side of the thermo-electric cooler;
a pump within the interior of the case;
tubing connected to the pump and within the interior of the case, the tubing comprising:
a first section positioned adjacent to the first side of the thermo-electric cooler, and
a second section positioned adjacent the second outer side of the case and such that the first section is between the thermo-electric cooler and the second section, wherein the pump is configured to pump coolant through the tubing between the second section and the first section, thereby facilitating cooling of the coolant by the thermo-electric cooler; and
a power source within the interior of the case, the power source configured to power the pump and power the thermo-electric cooler.

2. The case of claim 1, further comprising a temperature sensor configured to measure a temperature of an electronic device positioned on the second outer side of the case, wherein, when the temperature detected by the temperature sensor exceeds a maximum temperature, the pump is activated.

3. The case of claim 2, further comprising an input button configured to adjust the maximum temperature.

4. The case of claim 1 wherein the second outer side of the case is configured to receive an electronic device to be cooled.

5. The case of claim 1, wherein the tubing is made of copper, aluminum, or iron.

6. The case of claim 1, further comprising a shock absorbing lining adjacent to at least one side of the power source and the pump.

7. The case of claim 6, wherein the shock absorbing lining is one of rubber, polyurethane, or silicone.

8. The case of claim 1, wherein the coolant is water, liquid nitrogen, or a glycol solution.

9. The case of claim 1, wherein the case further comprises a display configured to convey temperature of the coolant.

10. The case of claim 1, wherein the thermo-electric cooler comprises a plurality of ceramic plates.

11. The case of claim 1, wherein the protective barrier is made of rubber.

12. The case of claim 1, wherein the protective barrier hermetically seals the tubing within the case.

13. The case of claim 1, wherein the power source is a removable battery.

14. The case of claim 1, wherein the tubing is arranged in a planar spiral.

15. A case comprising:
- a protective barrier defining an interior of the case, a first outer side of the case, and a second outer side of the case;
- a thermo-electric cooler positioned within the interior of the case, the thermo-electric cooler comprising a first side and a second side opposite the first side, wherein the thermo-electric cooler is configured to transfer heat from the first side to the second side;
- a pump;
- a length of tubing connected to the pump and comprising:
  - a first section positioned adjacent to the first side of the thermo-electric cooler, and
  - a second section positioned adjacent the second outer side of the case and such that the first section is between the thermo-electric cooler and the second section, wherein the pump is configured to pump coolant through the length of tubing between the second section and the first section, thereby facilitating cooling of the coolant by the thermo-electric cooler;
- a power source configured to power the pump and power the thermo-electric cooler; and
- a shock absorbing lining adjacent to at least one side of the power source and the pump.

* * * * *